United States Patent [19]

Beavitt et al.

[11] 3,825,801

[45] July 23, 1974

[54] ELECTRICAL INTEGRATED CIRCUIT PACKAGE

[75] Inventors: Alan Robert Beavitt, Towcester; John Peter McCarthy, Weston Favall, both of England

[73] Assignee: Plessey Handel Und Investments A.G., Zug, Switzerland

[22] Filed: Jan. 30, 1973

[21] Appl. No.: 327,904

[30] Foreign Application Priority Data

Feb. 23, 1972 Great Britain ..................... 8257/72

[52] U.S. Cl..... 317/101 CP, 317/101 CC, 339/17 F
[51] Int. Cl. ............................................ H05k 5/00
[58] Field of Search ............... 317/101 CC, 101 CP; 339/17 F; 324/158 F

[56] References Cited

UNITED STATES PATENTS 3,205,408 9/1965 Boehm et al.................. 317/101 CP
3,407,925 10/1968 Ruehlmann ................. 317/101 CC

*Primary Examiner*—David Smith, Jr.
*Attorney, Agent, or Firm*—Scrivener Parker Scrivener & Clarke

[57] ABSTRACT

An integrated circuit package includes conductors (3) bonded between a cover (9) and a base (13) which has a cavity (14) in which a chip (12) is received. Each conductor (3) joins an attach pad (1) which protrudes into the cavity (14) with a contact (2) which projects (7, 8) through a window (10) in the cover (9). When bolted (20) to a printed circuit board (16), the contact projections (7, 8) make contact with contact areas (18) on the board.

4 Claims, 8 Drawing Figures

ELECTRICAL INTEGRATED CIRCUIT PACKAGE

Figure 1:
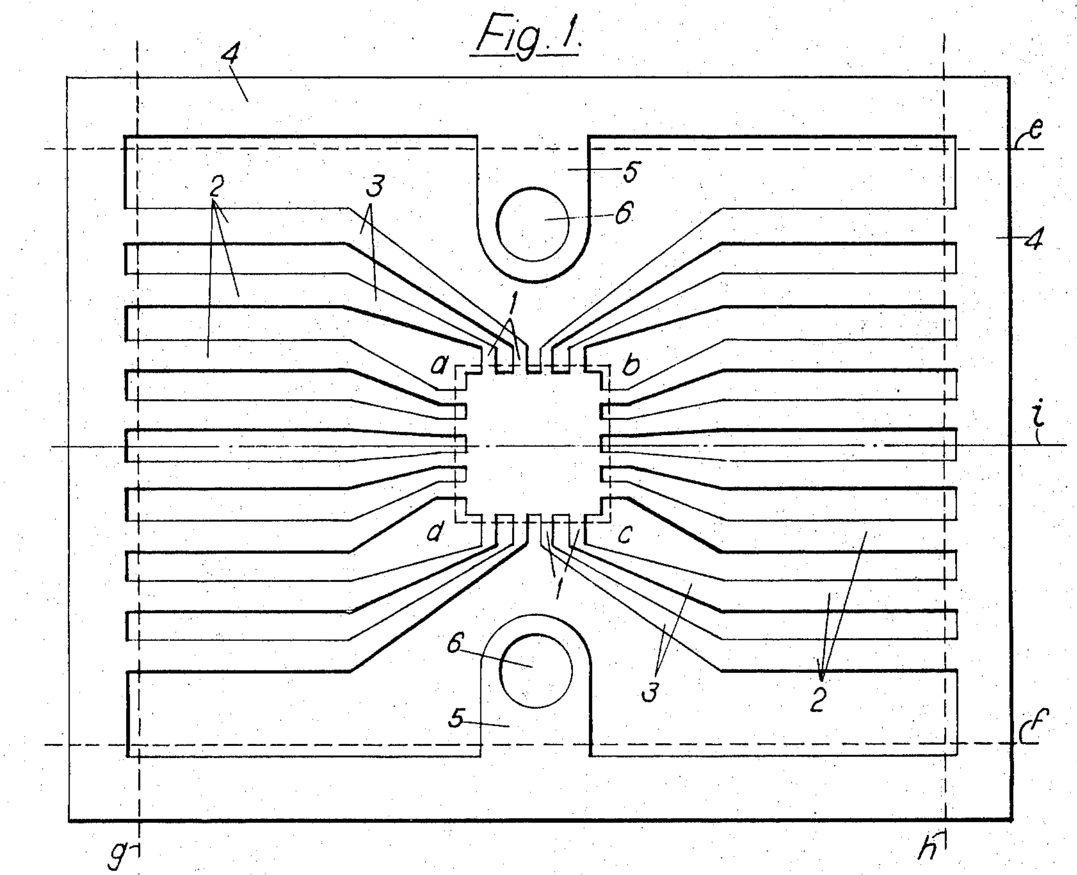

This invention relates to carriers for electrical integrated circuit chips.

It is known to provide electrical circuits as an integral constituent of a complex body termed a chip. Chips commonly measure a few millimetres square. Other electrical circuits are frequently carried on printed circuit boards which may for example measure 30 cm × 10 cm. To permit a chip to be handled conveniently, the chip is received in a carrier, the combination of chip and carrier being termed a package. The carrier has a number of conductors, each of which terminate at one end at an attach pad and at the other end at a contact. The attach pads are closely pitched to accord with the spacing of conductive areas of the chip. The pitch of the contacts, which is considerably greater than the pitch of the attach pads, is chosen to facilitate connection with the circuits on a printed circuit board.

In known packages it is common to form the contacts as projecting tags. When such a package is mounted on a printed circuit board, electrical connection to the tags is made by soldering through suitably positioned holes in the board. Since a package may have more than sixty tags to be soldered, this arrangement is inconvenient when the replacement of a chip becomes necessary and the soldered connections have to be broken. An alternative arrangement is to make the projecting tags in the form of diaphragms, and to provide the board with suitably spaced conductive pins, each pin piercing a diaphragm to establish the desired electrical connection. In a further arrangement the contacts do not project, but take the form of conductive areas on a surface of the package. An edge connector is fastened to the board, conductive springs in the edge connector establishing the desired connections when an edge of the package is inserted in the connector.

According to the invention there is provided a carrier for an electrical integrated circuit chip comprising conductive strips of resilient material secured between a base of insulating material and a cover of insulating material, the base having a cavity in which a chip can be received, a conductive strip having an attach pad at one end of the strip and a contact at the other end of the strip, the attach pad protruding into the cavity and the contact rising proud of the base by a distance exceeding the thickness of the cover, and the cover having windows through which the contacts project. Such a carrier can be bolted or clamped to a printed circuit board with the cover adjacent to the surface of the board which carries the printed circuitry. The contacts project through the windows of the cover and make physical and electrical contact with contact areas of the printed circuitry. Soldering is not required. If a chip has to be replaced, the bolts or clamp are loosened and the package — that is, the carrier and chip — is withdrawn from the board and a new package is substituted. By bolting or clamping the carrier direct to the printed circuit board, the desired electrical connections are made without the need for an edge connector or other separate piece to act as an intermediary.

In this specification and claims the term "integrated circuit chip" is to be read as including a chip which accommodates only one electrical component. Also, the term "printed circuit board" is to be read as including boards prepared by any one of the well-known processes equivalent to photographic printing, for example, by the use of adhesive strip.

Figure 4A:
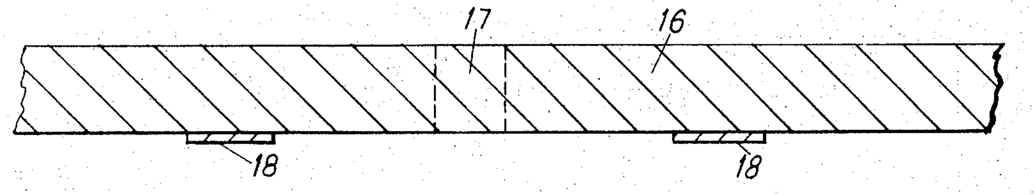
Figure 4B:
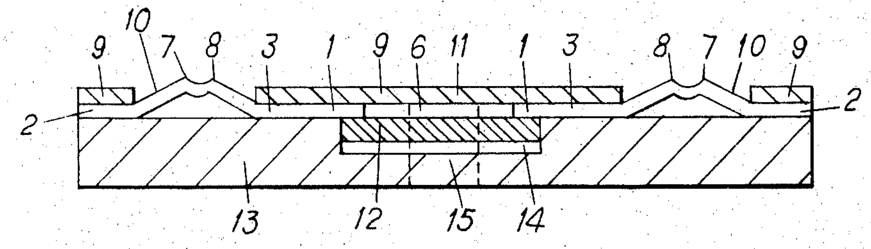
Figure 2:
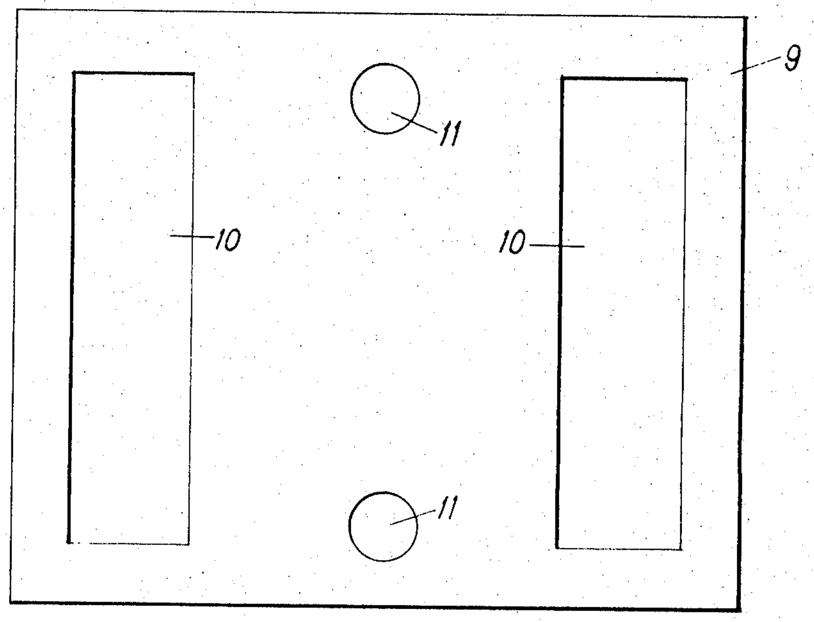
Figure 3:
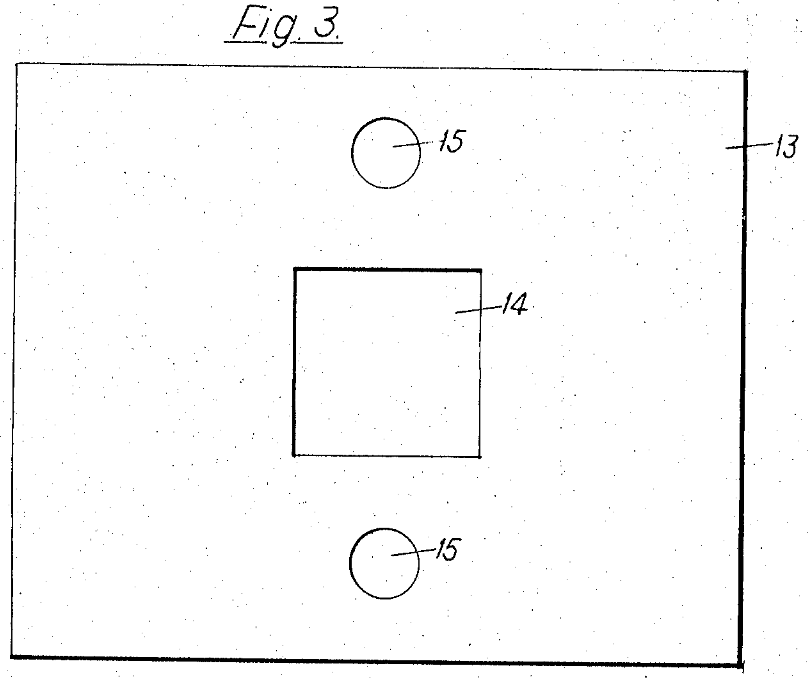
Figure 5A:
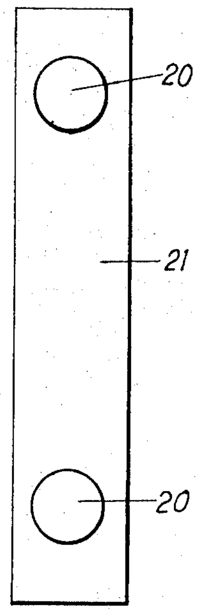
Figure 5B:
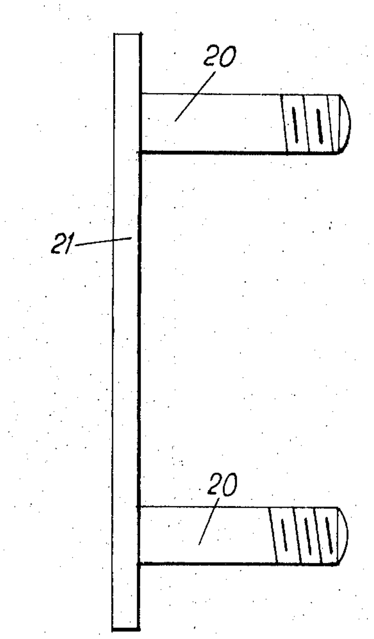

The invention will now be described with reference to the accompanying drawings in which:

FIG. 1 shows a conductive frame used in making a carrier forming part of a package according to the invention, FIG. 2 shows an insulating cover forming part of such a package, FIG. 3 shows an insulating base forming part of such a package, FIG. 4*a* is a sectional view of part of a printed circuit board, FIG. 4*b* is a sectional view of a package according to the invention, the section being taken along the line *i* of FIG. 1, FIGS. 5*a*, 5*b* are two views of a fastener for use with some packages according to the invention.

Figure 6:
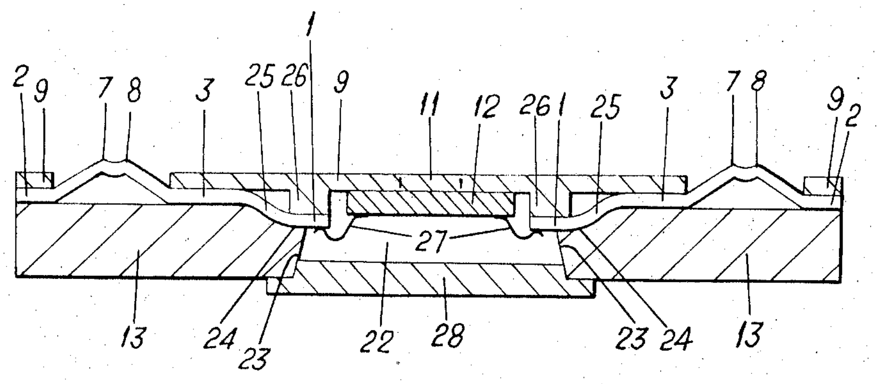

FIG. 6 is a view similar to FIG. 4*b* showing a modified construction of a package according to the invention.

To make a package according to the invention, a sheet of conductive material, conveniently beryllium copper, is stamped or otherwise processed to form a stencilled patterned frame shown in FIG. 1. The frame comprises a pattern formed by attach pads 1 ranged along the sides of a central square *abcd*. Contacts 2 are ranged in rows parallel to two opposite sides *ad*, *bc* of the central square. There is a contact 2 corresponding to each attach pad 1. Conductors 3 connect the attach pads 1 to their corresponding contacts 2. The pads, contacts and conductors are enclosed within a marginal band 4, which is ultimately removed by cropping along the lines *e*, *f*, *g*, *h*. The central square is also eventually removed by cropping along its periphery *abcd*. From the marginal band 4 two stubs 5 extend inwardly towards the mid points of the sides *ab*, *cd* of the central square. Each stub 5 is pierced by a locating hole 6.

The attach pads 1 are positioned and dimensioned to accord with conductive areas of an integrated circuit chip, which is subsequently to be included in a package in which a carrier formed by the frame of FIG. 1 will also be included. The contacts 2 are positioned and dimensioned to be compatible with contact areas on a printed circuit board on which the package in question is to be mounted. If the package is to be sealed by glass, the frame of FIG. 1 must be made of a material having a matching coefficient of expansion. Such a material is marketed under the registered trade mark "Kovar."

The contacts 2 are then treated so as to be suitable for making direct contact with the contact areas of the printed circuit board. Preferably the treatment includes both shaping and plating. Preferably the shaping comprises a pressing operation whereby each contact is convoluted to present the double-crested configuration discussed in U.S. Pat. specification No. 46,621/71. Preferably the plating comprises plating the crests with gold. It is also generally desirable to plate the attach pads with gold.

The results of this treatment are apparent in FIG. 4*b*, where the two crests of a contact 2 are shown at 7, 8. The shaping of the contacts 2 involves a reduction in their overall length. Consequently the marginal band 4 has to be similarly shaped, if distortion is to be avoided and the locating holes 6 are ultimately to serve their purpose. The central square *abcd*, which gave support to the attach pads 1 during the stamping and shaping processes, is now removed by cropping along its periphery.

To form a carrier, the shaped and plated frame is bonded to a cover 9 of insulating material. The cover 9 (FIG. 2) has two windows 10 through which the crests 7, 8 (FIG. 4b) of contacts 2 may pass. The cover 9 also has two locating holes 11. In forming the carrier, the cover 9 is bonded to the frame so that the crests 7, 8, pass through the windows 10, and the locating holes 6, 11 are in register. This is apparent in FIG. 4b. The cover 9 is dimensioned so as not to foul the crests (not shown) formed in the marginal band 4 (FIG. 1). That is to say the cover 9 is bounded by the lines *e, f* of FIG. 1. In the direction perpendicular to the lines *e, f,* the cover 9 is bounded by the lines *g, h.*

Among the materials suitable for the insulating cover 9 are plastics, ceramics or glazed metal. If a plastic or ceramic is used, the bonding may be effected by an epoxy adhesive, conveniently in the form of a screen printed layer. In the case of ceramic, bonding may be effected by solder glass. During the bonding process, the frame may be pressed between the cover 9 and a platen in order to prevent buckling, the platen being covered with a release agent.

An insulating base 13 (FIG. 3) conveniently of the same material as the cover 9, has the same superficial dimensions as the cover 9, but is thick enough to accommodate a central cavity 14 in its upper surface. The base 13 is pierced by two locating holes 15. As shown in FIG. 4b, the upper surface of the base 13 is bonded to the frame (of FIG. 1) on the opposite face to the cover 9, the chip 12 being received in the cavity 14. The locating holes 15 register with the locating holes 6, 11. The bonding of the base 13 is effected similarly to the bonding of the cover 9.

Finally the marginal band 4 is removed by cropping along the lines *e, f, g, h* of FIG. 1, leaving the completed package as shown in FIG. 4b. The package comprises the integrated circuit chip 12 and its carrier. The carrier comprises the bonded assembly of base 13, cover 9, and intervening attach pads 1, contacts 2 and conductors 3.

A printed circuit board 16 (FIG. 4a) has locating holes, one of which is shown at 17, which register with the locating holes 6, 11, 15. The board 16 carries contact areas 18 dimensioned and positioned so that each contact area 18 makes contact with both the crests 7, 8 of a conductor 2. The package of FIG. 4b is mounted on the board 16 by passing bolts (not shown) through aligned holes 6, 11, 15, 17 and clamping by means of nuts (not shown), or other suitable fixing device. The thickness of the cover 9 is chosen so as to stop the clamping process when a desired contact pressure has been attained at the crests 7, 8.

An alternative method of making the package of FIG. 4b involves bonding the frame of FIG. 1 to the base 13 before the bonding of the cover 9. The chip 12 is then inserted into the cavity 14, where it is secured by means of a conducting adhesive or by eutective bonding to a gold layer, according to whether the base 13 is a plastic or a locally metallized ceramic. Connection to the attachment pads is then effected by uphill wire bonding. The cover 9 is then presented and bonded as before, recesses being formed in its under surface, if required, to afford clearance at the attach pads 1 for wires used in the uphill bonding process.

Further alternative methods of making a package reside in the use of a fastener, which as shown in FIGS. 5a, 5b, comprises two studs 20 carried on a spacing strip 21 at a spacing consistent with the holes 6 (FIG. 1). In one method, the fastener is moulded integrally into the base 13 (FIG. 3), the studs 20 replacing—bolts in—the holes 15. To form a carrier, the cover 9 and base 13 are bonded to the frame as previously described. The fastener is made of a material such as metal which is a good conductor of heat. After the chip 12 has been inserted in the cavity 14, thermal contact between the chip and the fastener is established by conducting epoxy or eutectic bonding. Finally the studs 20 are passed through holes 17 in a printed circuit board 16, nuts (not shown) being used to effect the fastening action. In another method the chip 12, after being attached to the attach pads 1 of the shaped and plated frame, is encapsulated, together with the spacing strip 21, in a plastics moulding having the external dimensions of the cover 9 and base 13 together. Fastening is effected as previously described.

In connection with the use of uphill bonding, reference was made to the need for adequate clearance at the attach pads 1, and it was suggested that recesses might be formed in the upper surface of the cover 9. A construction of the carrier modified to provide adequate clearance is shown in FIG. 6. In this construction, the cavity 14 becomes a hole 22 which penetrates the entire thickness of the base 13. The hole 22, which may be circular instead of rectangular, need not be a close fit for the chip 12. If desired, the walls of the hole 22 may be tapered as shown at 23. A central strip is cut away from the upper surface of the base 13 to form a depression running across the base parallel to the rows of contacts 2. The width of the depression exceeds that of the hole 22 so that a platform 24 is formed around the hole. During the pressing operation in which the crests 7, 8 are formed in the contacts 2, the conductors 3 are shanked at 25 so as to enter the depression and lie on the platform 24. (The margin 4 is correspondingly shanked). Underneath the cover 9, a spacer 26 is provided which enters the depression and supports the attach pads 1. The chip 12 is positioned on the under surface of the cover 9 with its conductive areas on its lower face. Bond wires 27 join the conductive areas of chip to the attach pads 1. A lid 28 closes the hole 22 at the under surface of the base 13.

To assemble the package shown in FIG. 6, the frame (FIG. 1), after shaping and plating, is bonded to the base 13, the shanks 25 entering the central depression so that the attach pads 1 rest on the platform 24. The cover 9 is then bonded to the other side of the frame, the spacer 26 being first placed in position if it is a separate entity. The carrier is then inverted, and the chip 12 lowered through the hole 22 on to the cover 9. Next, bond wires 27 are run from the attach pads 1 to conductive areas on the chip 12, the hole 22 providing ample clearance for this operation. Finally the hole 22 is closed by the lid 28. The package is the ready for mounting on printed circuit board in a manner already described.

It is to be understood that the foregoing description of specific examples of this invention is made by way of example only and is not to be considered as a limitation in its scope.

What is claimed is:

1. A carrier for an electrical integrated circuit chip comprising conductive strips of resilient material secured between a base of insulating material and a cover of insulating material, the base having a cavity in which a chip can be received, each conductive strip having an attach pad at one end of the strip and a contact at the other end of the strip, the attach pad protruding into the cavity and the contact rising—clear—of the base by a distance exceeding the thickness of the cover, and the cover having windows through which the contacts project.

2. A carrier as claimed in claim 1 in which the conductive strips are bonded to the base and cover, and in which a contact comprises twin crests spaced from each other along the length of the conductive strip.

3. A carrier as claimed in claim 1 in which the cavity penetrates the thickness of the base to form a hole, in which the base has a surface depression forming a platform around the hole, and in which the conductive strips are shanked to conform with the depression and to present attach pads which rest on the platform.

4. A carrier as claimed in claim 1 which includes studs by which the carrier may be bolted to a printed circuit board.

* * * * *